United States Patent [19]

Shier

[11] Patent Number: 4,851,838

[45] Date of Patent: Jul. 25, 1989

[54] SINGLE CHIP SUCCESSIVE APPROXIMATION ANALOG-TO-DIGITAL CONVERTER WITH TRIMMABLE AND CONTROLLABLE DIGITAL-TO-ANALOG CONVERTER

[75] Inventor: John S. Shier, Apple Valley, Minn.

[73] Assignee: VTC Incorporated, Bloomington, Minn.

[21] Appl. No.: 134,758

[22] Filed: Dec. 18, 1987

[51] Int. Cl.$^4$ ............................................. H03M 1/38
[52] U.S. Cl. .................................. 341/121; 341/128; 341/134; 341/156; 341/165
[58] Field of Search ............... 341/120, 121, 128, 134, 341/156, 159, 165, 167

[56] References Cited

U.S. PATENT DOCUMENTS

| | | | |
|---|---|---|---|
| 4,196,420 | 4/1980 | Culmer et al. | 340/347 |
| 4,198,622 | 4/1980 | Connolly, Jr. et al. | 340/347 |
| 4,200,863 | 4/1980 | Hodges et al. | 340/347 |
| 4,228,423 | 10/1980 | Schwerdt | 340/347 |
| 4,266,292 | 5/1981 | Regan et al. | 370/13 |
| 4,281,319 | 7/1981 | Roberts, Jr. | 340/347 |
| 4,308,524 | 12/1981 | Harrison | 340/347 |
| 4,314,235 | 2/1982 | Ruf et al. | 340/347 |
| 4,323,887 | 4/1982 | Buurma | 340/347 |
| 4,335,371 | 6/1982 | Connolly, Jr. et al. | 340/347 |
| 4,336,526 | 6/1982 | Weir | 340/347 |
| 4,348,658 | 9/1982 | Carter | 340/347 |
| 4,350,974 | 9/1982 | Gordon et al. | 340/347 |
| 4,358,752 | 11/1982 | Tamada et al. | 340/347 |
| 4,381,496 | 4/1983 | Carter | 340/347 |
| 4,384,274 | 5/1983 | Mao | 340/347 |
| 4,384,277 | 5/1983 | Allgood et al. | 340/347 |
| 4,385,286 | 5/1983 | Haque | 340/347 |
| 4,388,612 | 6/1983 | Takagi et al. | 340/347 |
| 4,395,701 | 7/1983 | Evans | 340/347 |
| 4,396,905 | 8/1983 | Chan et al. | 340/347 |
| 4,399,426 | 8/1983 | Tan | 340/347 |
| 4,400,689 | 8/1983 | Brokaw et al. | 340/347 |
| 4,400,690 | 8/1983 | Brokaw et al. | 340/347 |
| 4,410,880 | 10/1983 | Zaborowski | 340/347 |
| 4,415,882 | 11/1983 | Akazawa et al. | 340/347 |
| 4,427,973 | 1/1984 | Brokaw et al. | 340/347 |
| 4,431,986 | 2/1984 | Haque et al. | 340/347 |
| 4,441,198 | 4/1984 | Shibata et al. | 377/78 |
| 4,451,820 | 5/1984 | Kapral | 340/347 |
| 4,454,500 | 6/1984 | Kato et al. | 340/347 |
| 4,458,237 | 7/1984 | Domogalla | 340/347 |
| 4,460,891 | 7/1984 | Bernstein | 340/347 |
| 4,476,456 | 10/1984 | Domogalla | 340/347 |
| 4,485,372 | 11/1984 | Holloway | 340/347 |
| 4,498,072 | 2/1985 | Moriyama | 340/347 |
| 4,521,762 | 6/1985 | Kapral | 340/347 |
| 4,523,179 | 6/1985 | Kapral | 340/347 |
| 4,527,148 | 7/1985 | Kuboki et al. | 340/347 |
| 4,536,744 | 8/1985 | Brown | 340/347 |
| 4,544,914 | 10/1985 | Chan et al. | 340/347 |
| 4,547,766 | 10/1985 | Brokaw et al. | 340/347 |
| 4,556,870 | 12/1985 | Brokaw et al. | 340/347 |
| 4,568,913 | 2/1986 | Evans | 340/347 |
| 4,571,507 | 2/1986 | Collings | 307/350 |
| 4,581,602 | 4/1986 | Reichart | 340/347 |
| 4,611,196 | 9/1986 | Fernandez | 340/347 |

OTHER PUBLICATIONS

Alan B. Grebene, *Bipolar and MOS Analog Integrated Circuit Design*, Chapter 15.

Primary Examiner—William M. Shoop, Jr.
Assistant Examiner—G. Romano
Attorney, Agent, or Firm—Kinney & Lange

[57] ABSTRACT

A single chip monolithic integrated successive approximation analog-to-digital converter includes a test mode terminal for receiving shift register test mode control signals and successive approximation mode control signals. Digital test data signals are applied to a test data terminal. A trimmable digital-to-analog converter (DAC) is connected to receive digital signals and converts these signals to analog signals of corresponding values. A successive approximation and shift register is coupled to the test mode terminal and the test data terminal. During post-fabrication processing, the successive approximation and shift register operates in a shift register test mode in response to the test mode control signals. Test signals of a known value are serially received and applied in parallel to the DAC. The DAC can then be trimmed to required specifications. The successive approximation and shift register operates in a successive approximation mode in response to successive approximation mode control signals.

5 Claims, 6 Drawing Sheets

SINGLE CHIP SUCCESSIVE APPROXIMATION ANALOG-TO-DIGITAL CONVERTER WITH TRIMMABLE AND CONTROLLABLE DIGITAL-TO-ANALOG CONVERTER

BACKGROUND OF THE INVENTION

1. Field of the Invention.

The present invention relates generally to successive approximation analog-to-digital converters. In particular, the present invention is a single chip successive approximation analog-to-digital converter with a trimmable and controllable digital-to-analog converter.

2. Description of the Prior Art.

Successive approximation analog-to-digital converters (ADCs) are in widespread use and are disclosed, for example, in the following United States patents:

| Inventor | U.S. Pat. No. |
| --- | --- |
| Brokaw et al. | 4,400,689 |
| Brokaw et al. | 4,427,973 |
| Shibata et al. | 4,441,198 |
| Brokaw et al. | 4,547,766 |
| Brokaw et al. | 4,556,870 |
| Collings | 4,571,507 |

Analog-to-digital converters of this type include a digital-to-analog converter (DAC) with its inputs fed from a successive approximation register (SAR). To begin a conversion, the DAC inputs are first set to an initial value (usually half-scale), and a comparator determines whether the input signal voltage is greater than or less than the DAC output voltage. This partial result and those subsequently determined partial results are held by the SAR. The SAR also sets up the DAC input values for succeeding comparisons as a function of previous comparisons in accordance with a successive approximation algorithm. This process is repeated until all bit values are determined.

Successive approximation analog-to-digital converters having twelve or more bits usually require some type of post-fabrication trimming (e.g., laser trimming) to achieve necessary accuracy. This is due to the fact that the "natural" matching of the integrated components is insufficient. It is the digital-to-analog converter which must be trimmed, since overall accuracy (linearity) of the conversion is set by its accuracy.

Most currently available twelve-bit ADCs of the successive approximation type have been made with hybrid techniques, and use laser trimming. In this approach, the DAC is fabricated on a separate chip from other components, thereby permitting separate trimming to required accuracy with full access to the DAC inputs. For a one-chip monolithic successive approximation ADC, however, this is not possible. The DAC inputs are "buried" on the chip and are not externally controllable.

It is evident that there is a continuing need for improved analog-to-digital converters of the successive approximation type. The ADC must be fabricated as a monolithic one-chip device in order to be produced at commercially viable prices. External control of the DAC inputs is required to permit trimming to required specifications. Power consumption and the number of transistors required for implementation must, of course, be kept to a minimum.

SUMMARY OF THE INVENTION

The present invention is a single chip integrated successive approximation analog-to-digital converter. Test mode control signals and successive approximation mode control signals are applied to test mode terminal means. Digital test data signals are applied to test data terminal means. A trimmable digital-to-analog converter (DAC) has input terminals for receiving digital signals, and converts the digital signals to analog signals of corresponding values. Successive approximation register means are coupled to the test mode terminal means and the test data terminal means. The successive approximation register means operates in a test mode and applies the test data signals to the input terminals of the DAC in response to the test mode control signals. Post-fabrication trimming of the DAC can then be performed to bring operating characteristics within required specifications. After the DAC has been trimmed, successive approximation mode control signals cause the successive approximation register means to operate in a successive approximation register mode.

In preferred embodiments, the test data terminal means serially receives the digital test data signals. Successive approximation register means comprises successive approximation and shift register means for serially receiving the test data signals and for providing the test data signals to the DAC in parallel. In still other embodiments, the successive approximation and shift register is implemented using bipolar transistors in a current mode logic arrangement. In this embodiment, only eight additional transistors per bit in the successive approximation and shift register are required. No additional power is consumed with this arrangement either.

DETAILED DESCRIPTION OF THE PREFERRED EMBODIMENTS

Figure 1:
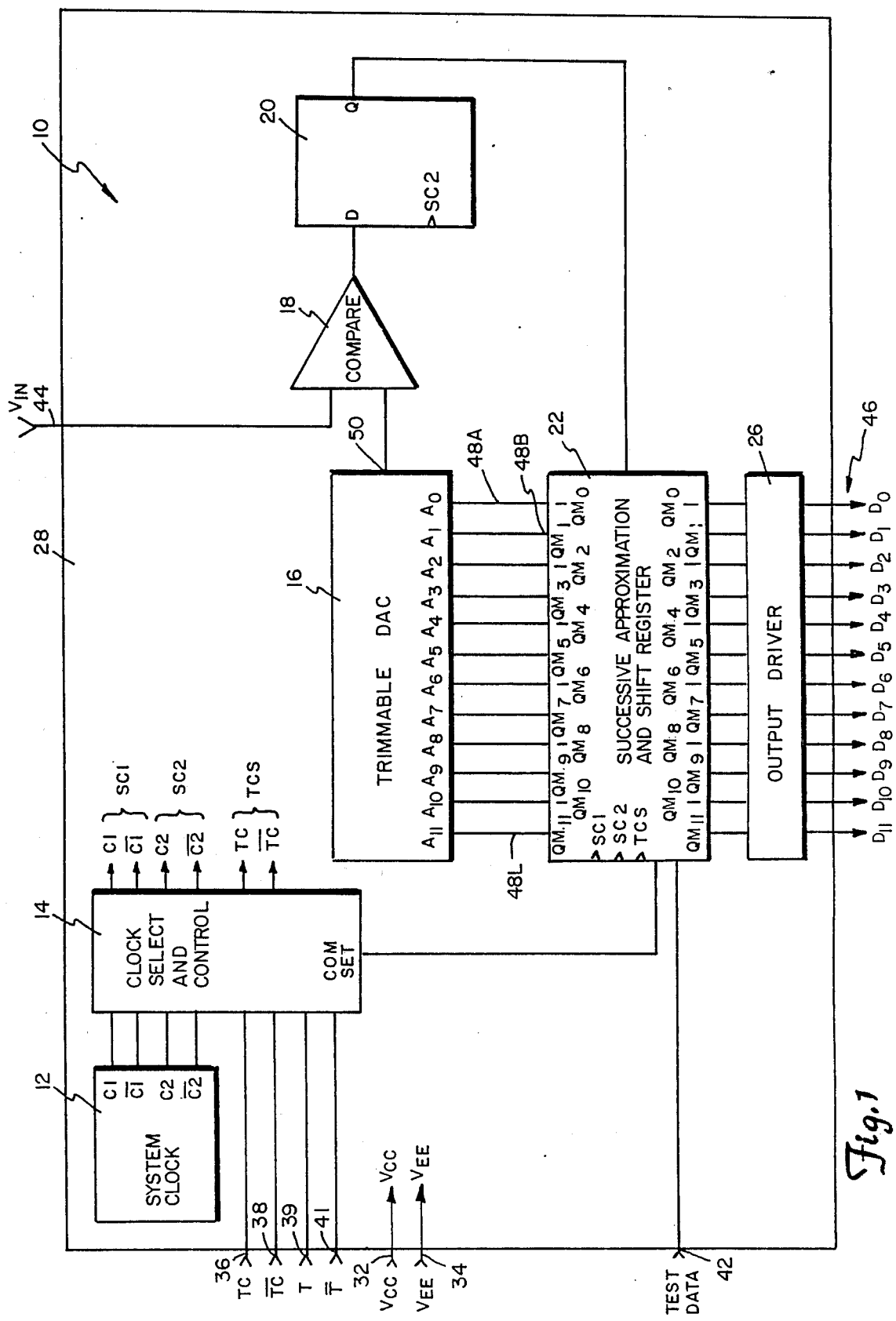
FIG. 1 is a schematic representation of a successive approximation analog-to digital converter in accordance with the present invention.

A successive approximation-type analog-to-digital converter 10 in accordance with the present invention is illustrated generally in FIG. 1. Analog-to-digital converter (ADC) 10 is a one-chip monolithic device which includes a system clock 12, clock select and control circuit 14, trimmable digital-to-analog converter (DAC) 16, comparator 18, D-type latch 20, successive approximation and shift register 22 and output driver circuitry 26, all of which are fabricated on a common substrate 28. External supply potentials VCC and VEE are applied to ADC 10 through terminal pins 32 and 34, respectively, and distributed in a known manner (not shown in FIG. 1). Test clock signals TC and $\overline{TC}$ are applied to clock select and control circuit 14 through terminal pins 36 and 38, respectively. Test mode control signals T and $\overline{T}$ are applied to clock select and control circuit 14 through terminal pins 39 and 41, respectively. A TEST DATA signal is received at terminal pin 42 and is coupled to successive approximation and shift register 22. Input signals $V_{IN}$ in the form of analog voltages are applied to ADC 10 through terminal pin 44. Digital output signals representative of the magnitude of input signals $V_{IN}$ are provided by ADC 10 at its output terminal 46. In the illustrated embodiment, ADC 10 is a twelve bit device which provides a twelve bit output signal having bits $D_0$-$D_{11}$.

DAC 16 is a trimmable digital-to-analog converter, and can be fabricated in accordance with any known technique which permits post-fabrication trimming or alteration of its elements to bring its electrical operating characteristics within required specifications. Laser trimming, zener-zapping, and link cutting, for example, are well known and commonly used techniques for this purpose.

Successive approximation and shift register 22 is configured to operate in both a successive approximation register mode, and in a shift register test mode. During post-fabrication testing and processing of ADC 10, a logic HIGH test mode signal T and a logic LOW test mode signal $\overline{T}$ are applied to terminal pins 39 and 41, respectively. Test mode signals of these logic states cause successive approximation and shift register 22 to operate in its shift register test mode, and to function as a shift register. A twelve bit digital TEST DATA signal having a known value is applied to terminal pin 42 and serially clocked into successive approximation and shift register 22. The twelve data bits of the TEST DATA signal are then presented at terminals $QM_0$-$QM_{11}$ and coupled to corresponding input terminals of trimmable DAC 16. Although successive approximation and shift register 22 is shown in FIG. 1 as having two sets of terminals $QM_0$-$QM_{11}$, this is done only for purposes of illustration, and corresponding terminals of the two sets can be common with one another. DAC 16 converts the digital signals received at its terminals $A_0$-$A_{11}$ to an analog signal of corresponding value which is coupled from output terminal 50 to comparator 18.

A test probe of a commercially available or otherwise known automatic circuit test and trimming system (not shown) can be applied to terminal 50 to monitor the analog voltage. Since the TEST DATA signal is of a known value, the automatic circuit test and trimming system can be used to perform post-fabrication trimming of DAC 16 in such a manner that a corresponding output voltage of desired specifications is provided at output terminal 50. After DAC 16 has been trimmed to desired specifications, further post-fabrication processing of clock select and control circuit 14 causes terminals 36, 38, 39 and 41 to be functionally disabled, and causes successive approximation and shift register 22 to function thereafter in its successive approximation and shift register mode.

In its successive approximation and shift register mode, successive approximation and shift register 22 functions as a successive approximation register, and cooperates with other circuit elements of ADC 10 in a known manner to convert analog input signals VIN to corresponding digital values. The digital values are provided at output terminals $QM_0$-$QM_{11}$ of successive approximation and shift register 22, and coupled as corresponding bits $D_0$-$D_{11}$ to output terminals 46 through output driver circuitry 26. As is evident from the above description, successive approximation and shift register 22 permits external control of the $A_0$-$A_{11}$, input terminals of DAC 16 which are otherwise "buried" on the chip, to facilitate post-fabrication trimming. Furthermore, in the embodiment described below, this mode of operation can be achieved without any additional power dissipation, and through the addition of only a few extra transistors.

For use in conjunction with a preferred embodiment of successive approximation and shift register 22 described below, system clock 12 generates two-phase non-overlapping complementary system clock signals C1 and C2, and their complements $\overline{C1}$ and $\overline{C2}$. These clock signals are applied to clock select and control circuitry 14 as shown in FIG. 1. System clock signals C1 and $\overline{C1}$, together denoted as signals SC1 in FIG. 1, and test clock signals TC and $\overline{TC}$, together denoted as signals TCS, are coupled to successive approximation and shift register 22 as shown. Clock signals C2 and $\overline{C2}$, together denoted as signals SC2 in FIG. 1, are coupled to latch 20 and to successive approximation and shift register 22.

An implementation of successive approximation and shift register 22 which uses NPN bipolar transistors interconnected in a three-level current mode logic (CML) arrangement is schematically illustrated in FIGS. 2A-2D. Successive approximation and shift register 22 is a twelve-bit device in this embodiment and includes bits B0-B11 and stop bit BS. Although circuitry for bits B1-B9 is not shown in FIGS. 2A-2D, these bits have a circuit layout identical to that of bits B0 and B10, and are interconnected in a similar manner which is evident from the drawing figures and following description. VCC and VEE supply potentials received at terminal pins 32 and 34, respectively, are distributed throughout bits B0-B11 and BS, and connected to their various transistors in the manner shown. A voltage source 24 which is connected to receive supply potentials VCC and VEE is configured to provide other required potentials including a current source voltage VCS which is applied to the base of transistors used as current sources, and a first level DC reference voltage VR which is coupled to the base of various transistors as shown.

Bit B11, the most significant bit of successive approximation and shift register 22, includes transistors which form a three input NOR gate 52, master RS flip-flop 54, and slave RS flip-flop 56. Least significant bit B0 includes transistors which form a two input NOR gate 58, a three input NOR gate 60, master RS flip-flop 62, and slave RS flip-flop 64. As described above, bits B1-B10 can be identical to bit B0. Elements of bit B10 which correspond to similar elements to bit B0 are identified by identical reference numerals which are primed. Stop bit BS includes transistors which form master RS flip-flop 66, and slave RS flip-flop 68.

Figure 2A:
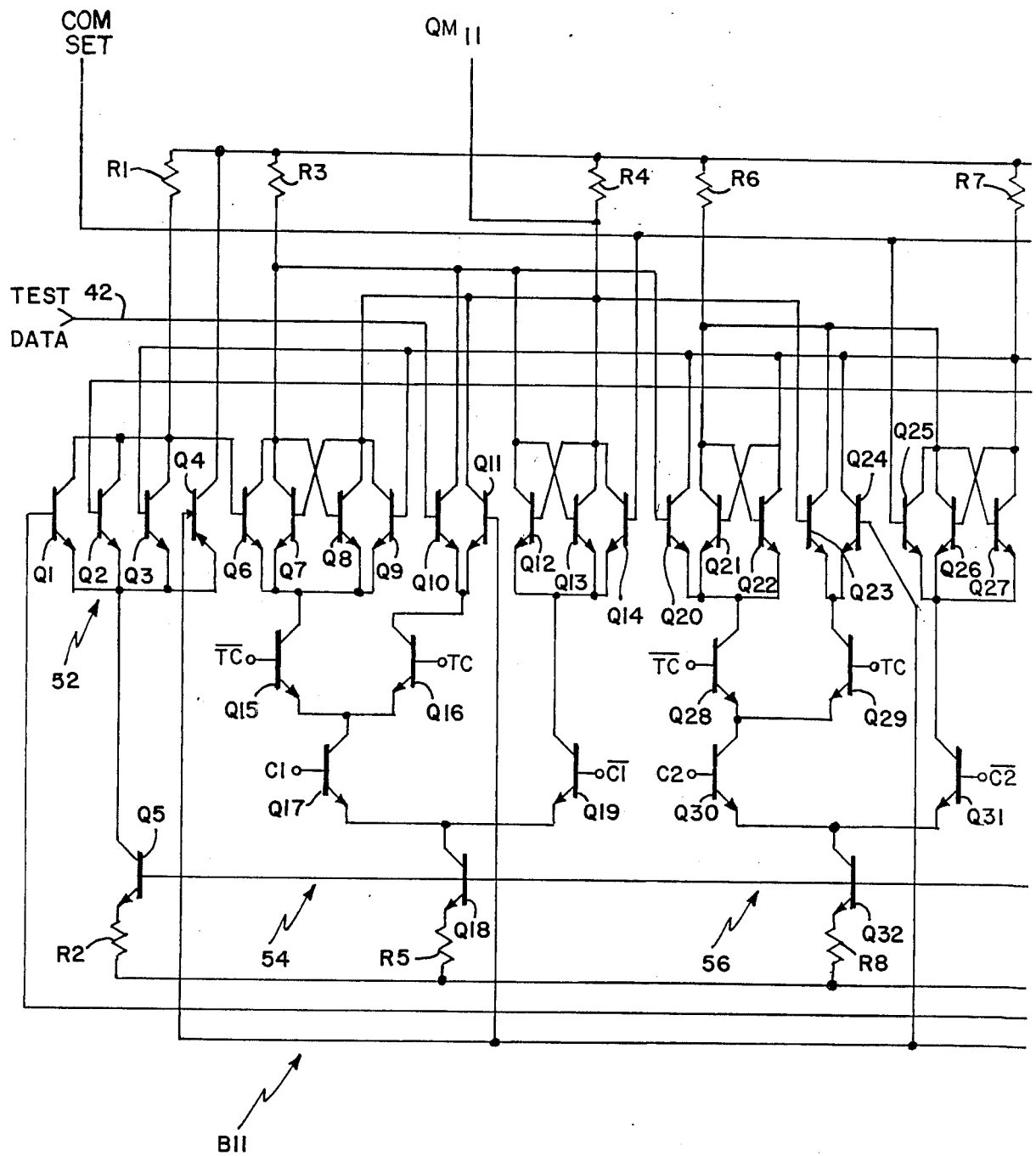
FIGS. 2A–2D schematically illustrate a preferred implementation of bits B10, B11, B0, and BS, respectively, of the successive approximation and shift register as shown in FIG. 1.

Referring specifically to the schematic diagram of bit B11 shown in FIG. 2A, NOR gate 52 is shown formed by transistors Q1-Q5 and resistors R1-R2. Master RS flip-flop 54 is formed by transistors Q6-Q19 and resistors R3-R5. Transistors Q12-Q14 of flip-flop 54 function together as a master latch. Slave flip-flop 56 is formed by transistors Q20-Q32 and resistors R6-R8. Transistors Q25-Q27 of flip-flop 56 function as a slave latch. Transistors Q10-Q11 and Q23-Q24 cooperate with the master and slave latches, respectively, when register 22 is operated in its shift register test mode.

Master flip-flop 54 is clocked by test clock signals TC and $\overline{TC}$ which are applied as second level signals to the bases of transistors Q16 and Q15, respectively, and by clock signals C1 and $\overline{C1}$ which are applied as third level signals to the bases of transistors Q17 and Q19, respectively. Slave flip-flop 56 is clocked by second level test clock signals TC and $\overline{TC}$, and by third level clock signals C2 and $\overline{C2}$. Test clock signal $\overline{TC}$ is applied to the base of transistor Q28, while test clock signal TC is applied to the base of transistor Q29. Clock signal C2 is applied to the base of transistor Q30, while clock signal $\overline{C2}$ is applied to the base of transistor Q31.

The emitters of transistors Q6-Q9 are coupled to the collector of transistor Q15, while emitters of transistors Q10 and Q11 are coupled to the collector of transistor Q16. The emitters of transistors Q12-Q14 are coupled to the collector of transistor Q19. The emitters of transistors Q15 and Q16 are connected to the collector of transistor Q17. The emitters of transistors Q17 and Q19 are connected to the collector of transistor Q18 which functions a current source.

The emitters of transistors Q20-Q22 are coupled to the collector of transistor Q28. The emitters of transistors Q23-Q24 are coupled to the collector of transistor Q29. The emitters of transistors Q28 and Q29 are tied together to the collector of transistor Q30. Emitters of transistors Q25-Q27 are tied to the collector of transistor Q31. Emitters of transistors Q30-Q31 are tied to the collector of transistor Q32 which functions as a current source.

The collector of transistor Q7 functions as the $\overline{QM}_{11}$ output terminal of master flip-flop 54, and is coupled to the base of transistor Q20 which functions as an R input terminal of slave flip-flop 56, to the collectors of transistor Q10 and Q12, and to the base of transistor Q13. The collector of transistor Q13 functions as the $QM_{11}$ output terminal of master flip-flop 54, and is connected to the $A_{11}$ input terminal of DAC 16 as shown in FIG. 1. The collector of transistor Q27 functions as the $QS_{11}$ output terminal of slave flip-flop 56 and is coupled to the base of transistor Q3 which functions as a first input terminal of NOR gate 52, to the base of transistor Q9 which functions as an R input terminal of master flip-flop 54, and also to the collectors of transistors Q24, Q22, and Q20.

The base of transistor Q1, which functions as a second input terminal of NOR gate 52, is connected to receive signals from the Q output terminal of latch 20. The base of transistor Q2 functions as a third input terminal of NOR gate 52, and is connected to the collector of transistor Q59' (FIG. 2B) which functions as the $\overline{QS}_{10}$ output terminal of slave flip-flop 64' of bit B10 (the next least significant bit). The collectors of transistors Q1-Q3 function as an output terminal of NOR gate 52 and are coupled to the base of transistor Q6 which functions as an S input terminal of master flip-flop 54.

Common set signals COM SET from clock select and control circuit 14 are coupled to the base of transistor Q14, and to the base of transistor Q25 which functions as an S input terminal of slave flip-flop 56. TEST DATA signals applied to terminal pin 42 are coupled to the base of transistor Q10.

Figure 2B:
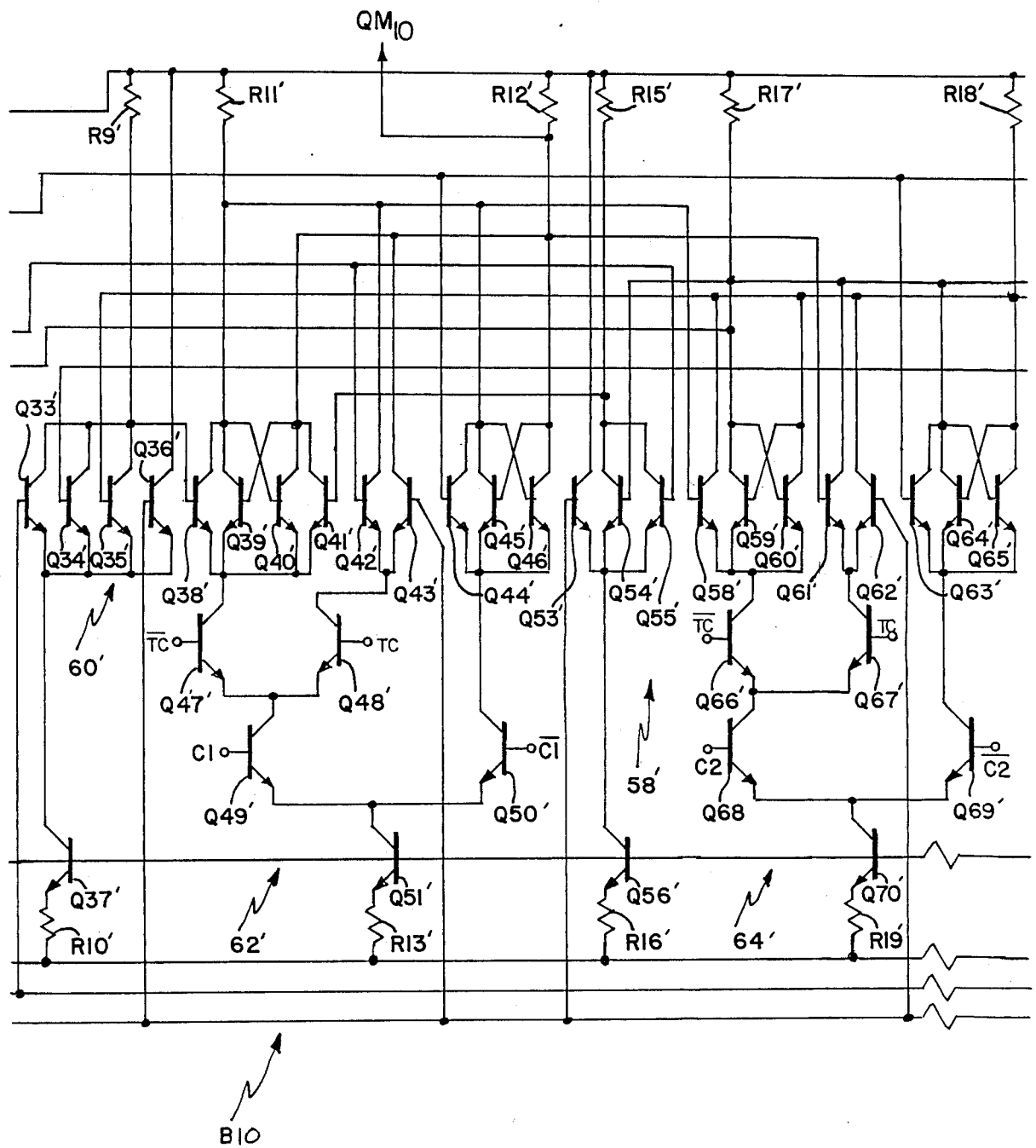
Figure 2C:
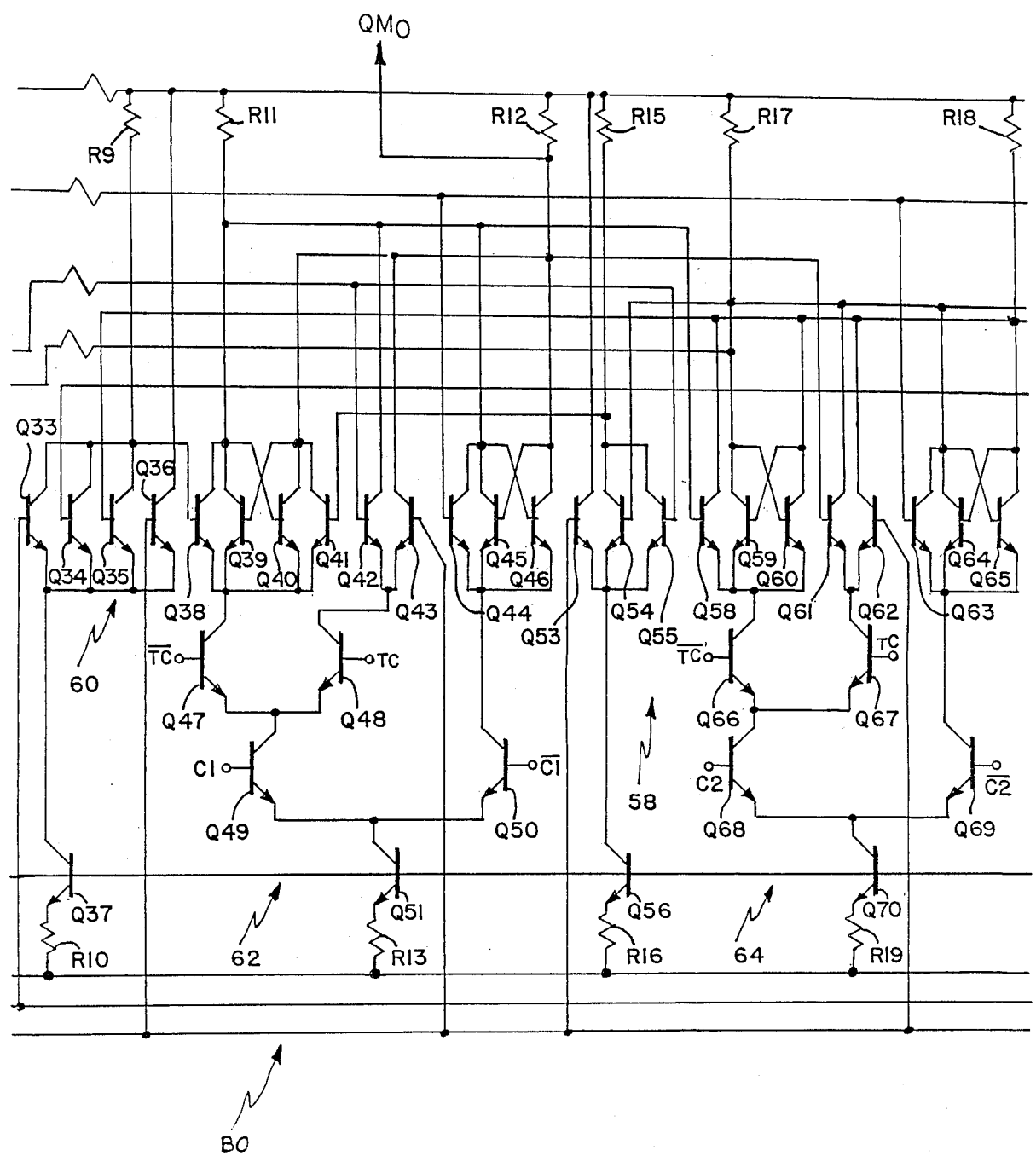

Referring now to the schematic diagram of bit B0 shown in FIG. 2C, NOR gate 60 is formed by transistors Q33-Q37 and resistors R9-R10. Slave flip-flop 62 is formed by transistors Q38-Q51 and resistors R11-R13. Transistors Q44-Q46 function as a master latch. NOR gate 58 is formed by transistors Q53-Q56 and resistors R15-R16. Slave flip-flop 64 is formed by transistors Q58-Q70 and by resistors R17-R19. Transistors Q63-Q65 function as a slave latch. Transistors Q42-Q43 and Q61-Q62 cooperate with the master and slave latches, respectively, when register 22 is operated in its shift register test mode.

Master flip-flop 62 is clocked by test clock signals TC and $\overline{TC}$ which are applied as second level signals to the bases of transistors Q48 and Q47, and by clock signals C1 and $\overline{C1}$ which are applied as third level signals to the bases of transistors Q49 and Q50, respectively. Slave flip-flop 64 is clocked by second level test clock signals TC and $\overline{TC}$, and by third level clock signals C2 and $\overline{C2}$. Test clock signal $\overline{TC}$ is applied to the base of transistor Q66, while test clock signal TC is applied to the base of transistor Q67. Clock signal C2 is applied to the base of transistor Q68, while clock signal $\overline{C2}$ is applied to the base of transistor Q69.

The emitters of transistors Q38-Q41 are coupled to the collector of transistor Q47. The emitters of transistors Q42-Q43 are coupled to the collector of transistor Q48. The emitters of transistors Q47 and Q48 are tied together and to the collector of transistor Q49. The collectors of transistors Q44-Q46 are tied together to the collector of transistor Q50. The emitters of transistors Q49 and Q50 are connected to the collector of transistor Q51 which functions as a current source.

The emitters of transistors Q58-Q60 are tied together to the collector of transistor Q66. The emitters of transistors Q61-Q62 are tied together to the collector of transistor Q67. The emitters of transistors Q66 and Q67 are connected to the collector of transistor Q68. The emitters of transistors Q63-Q65 are tied together to the collector of transistor Q69. The emitters of transistors Q68 and Q69 are tied together to the collector of transistor Q70 which functions as a current source.

The collector of transistor Q39 functions as a $\overline{QM}_0$ output terminal of master flip-flop 62, and is coupled to the base of transistor Q58 which functions as an R input terminal of slave flip-flop 64, as well as to the collectors of transistors Q42, Q44 and Q45. The collector of transistor Q46 functions as a $QM_0$ output terminal of master flip-flop 62, and is connected to the $A_0$ terminal of DAC 16 as shown in FIG. 1, as well as to the collectors of transistors Q40, Q41, and Q43, and the base of transistor Q61. The base of transistor Q38 functions as an S input terminal of flip-flop 62, and is coupled to the collectors of transistors Q33-Q35 which function as an output terminal of NOR gate 60. The base of transistor Q41 functions as an R input terminal of flip-flop 62 and is coupled to the collectors of transistors Q54 and Q55 which function as an output terminal of NOR gate 58.

The collector of transistor Q59 functions as a $\overline{QS}_o$ output terminal of slave flip-flop 64, and is coupled to the base of transistor Q54 which functions as a first input terminal of NOR gate 58. The collector of transistor Q65 functions as a $\overline{QS}_o$ output terminal of slave flip-flop 64 and is coupled to a base of transistor Q35 which functions as a first input terminal of NOR gate 60, as well as to the collectors of transistors Q58, Q60 and Q62. The base of transistor Q33 functions as a second input terminal of NOR gate 60 and is connected to the Q output terminal of latch 20. The base of transistor Q34 functions as a third input terminal of NOR gate 60 and is coupled to the collector of transistor Q84 which functions as the $\overline{QS}$ output terminal of slave flip-flop 68 of stop bit BS. The base of transistor Q55, which functions as a second input terminal of NOR gate 58, and the base of transistor Q42, are connected to receive signals from the QS output terminal of the slave flip-flop of the next most significant bit (i.e. bit B1, which is not shown in FIG. 2). The base of transistor Q63 which functions as an S input terminal of slave flip-flop 64, and the base of transistor Q44, are connected to receive the COM SET signal.

Bit B10 of successive approximation and shift register 22, which is schematically illustrated in FIG. 2B, is implemented in a manner identical to that of bit B0 described above. Elements of bit B10 similar to those of bit B0 are indicated in FIG. 2B with identical reference numerals which are primed.

The collector of transistor Q46' functions as the QM10 output terminal of master flip-flop 62' and is coupled to the A10 input terminal of DAC 16 as shown in FIG. 1, as well as to the collectors of transistors Q43', Q40', and Q41', and the base of transistor Q62'. The base of transistor Q55', which functions as a second input terminal of NOR gate 58' and the base of transistor Q42', are coupled to the collector of transistor Q27 which functions as the $QS_{11}$ output terminal of flip-flop 56 of bit B11 (the next most significant bit). The base of transistor Q34' functions as a third input terminal of NOR gate 60', and is connected to receive the $\overline{QS}$ signal from the slave flip-flop of the next least significant bit (i.e. bit B9, which is not shown in FIG. 2). Other interconnections of the transistors of bit B10 are similar to those of corresponding transistors of bit B0 and described above.

Figure 2D:
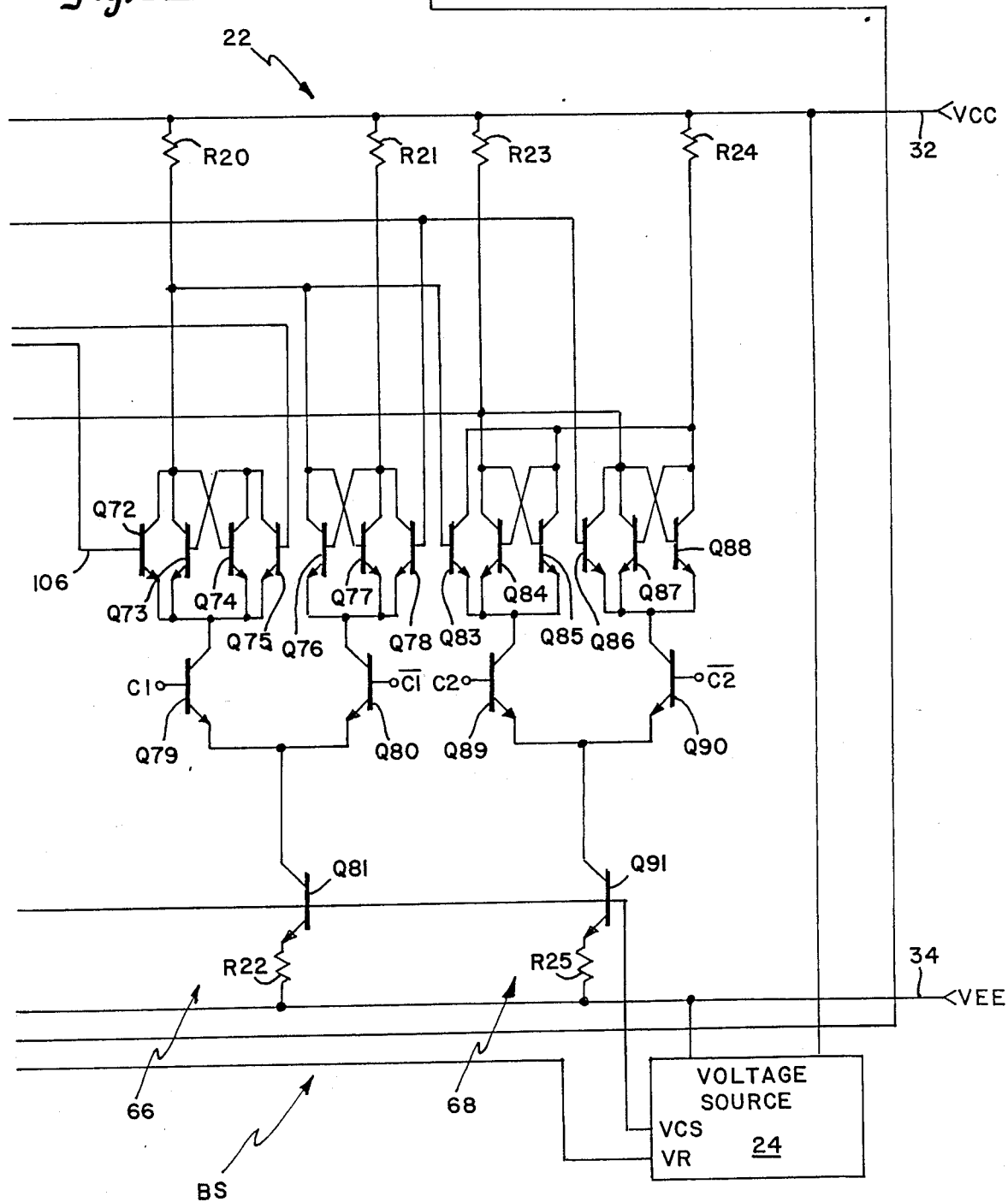

Stop bit BS is illustrated schematically in FIG. 2D. Master flip-flop 66 of bit BS is formed by transistors Q72–Q81 and resistors R20–R22. Transistors Q76–Q78 function as a master latch. Slave flip-flop 68 is formed by transistors Q83–Q91 and resistors R23–R25. Transistors Q86–Q88 function as a slave latch. The base of transistor Q79 is connected to receive clock signal C1, while the base of transistor Q80 is connected to receive clock signal $\overline{C1}$. Clock signal C2 is applied to the base of transistor Q89, while clock signal $\overline{C}$ is applied to the base of transistor Q90.

The emitters of transistors Q72–Q75 are tied together to the collector of transistor Q79. The emitters of transistors Q76–Q78 are tied together to the collector of transistor Q80. The emitters of transistors Q79–Q80 are connected together to the collector of transistor Q81, which function as a current source. The emitter of transistors Q83–Q85 are coupled to the collector of transistor Q89. The emitters of transistors Q86–Q88 are coupled to the collector of transistor Q90. The emitters of transistors Q89 and Q90 are tied together to the collector of transistor Q91, which functions as a current source.

The base of transistor Q72 functions as an S input terminal of master flip-flop 86 and is coupled to the collector of transistor Q65 which functions as the $QS_0$ output terminal of slave flip-flop 64 of bit B0 (FIG. 2C). The base of transistor Q75 functions as an R input terminal of master flip-flop 66 and is connected to the collector of transistor Q59 which functions as the $QS_0$ output terminal of slave flip-flop 64 of bit B0. The base of transistor Q83 functions as an R input terminal of slave flip-flop 86 and is coupled to the collector of transistor Q73 which functions as a $\overline{QM}$ output terminal of master flip-flop 66. The collector of transistor Q84 functions as the $\overline{QS}$ output terminal of slave flip-flop 68 and is connected to the base of transistor Q34 which functions as a third output terminal of NOR gate 60 of bit B0. The base of transistor Q86 which functions as an S input terminal of slave flip-flop 86, and the base of transistor Q78, are connected to receive the COM SET signals.

When it is desired to operate ADC 10 with successive approximation and shift register 22 in its successive approximation register mode during post-fabrication processing, test mode signals T and $\overline{T}$ having HIGH and LOW logic states are applied to terminal pins 39 and 41, respectively. Test clock signals TC and $\overline{TC}$ having HIGH and LOW logic states are simultaneously applied to terminal pins 36 and 38, respectively. Clock select and control circuitry 14 function as a multiplexor, and will thereby distribute test clock signals TC and $\overline{TC}$ having these logic states throughout successive approximation and shift register 22 as described above. Transistors Q16 and Q29 of bit B11, and transistors Q67–Q67' and Q48–Q4S' of bits B0–B10, respectively, will be clocked (switched) to their ON state. Concurrently, transistors Q15 and Q28 of bit B11, transistors Q47–Q47' and Q66–Q66' of bits B0–B10, respectively, will be switched OFF. A predetermined twelve data bit TEST DATA signal is then applied to terminal pin 42 in synchronization with twelve cycles of system clock signals C1, $\overline{C1}$, C2 and $\overline{C2}$. This clocking will cause the TEST DATA signal to be successively clocked into and latched by the master and slave latches of bits B11–B0.

Digital signals applied to terminals $A_0$–$A_{11}$ of trimmable DAC 16 from corresponding bits B0–B11 of successive approximation and shift register 22 will thereby correspond to the logic states of the corresponding bits of the TEST DATA signal. Since the TEST DATA signal is of a known value, the value of the digital signal applied to terminals A0–A11 of DAC 16 is also known. The analog output signal provided at output terminal 50 of DAC 16 can be monitored through use of a test probe. Any trimming technique for which DAC 16 was designed can then be implemented to trim the DAC so as to provide an analog output signal corresponding within required specifications to the known digital input signal. Trimming procedures and techniques of this type are well known.

Following post-fabrication trimming of DAC 16 in the above described manner, other post-fabrication processing steps can be implemented on clock select and control circuit 14 to permanently tie test clock signal TC to its logic LOW state, and test clock signal $\overline{TC}$ to its logic HIGH state. Connections between terminals 39 and 41 are also permanently disabled. Accidental operation of ADC in its shift register test mode which might otherwise be caused through the application of signals to terminal pins 36, 38, 39 and 41 is thereby prevented.

Figure 3:
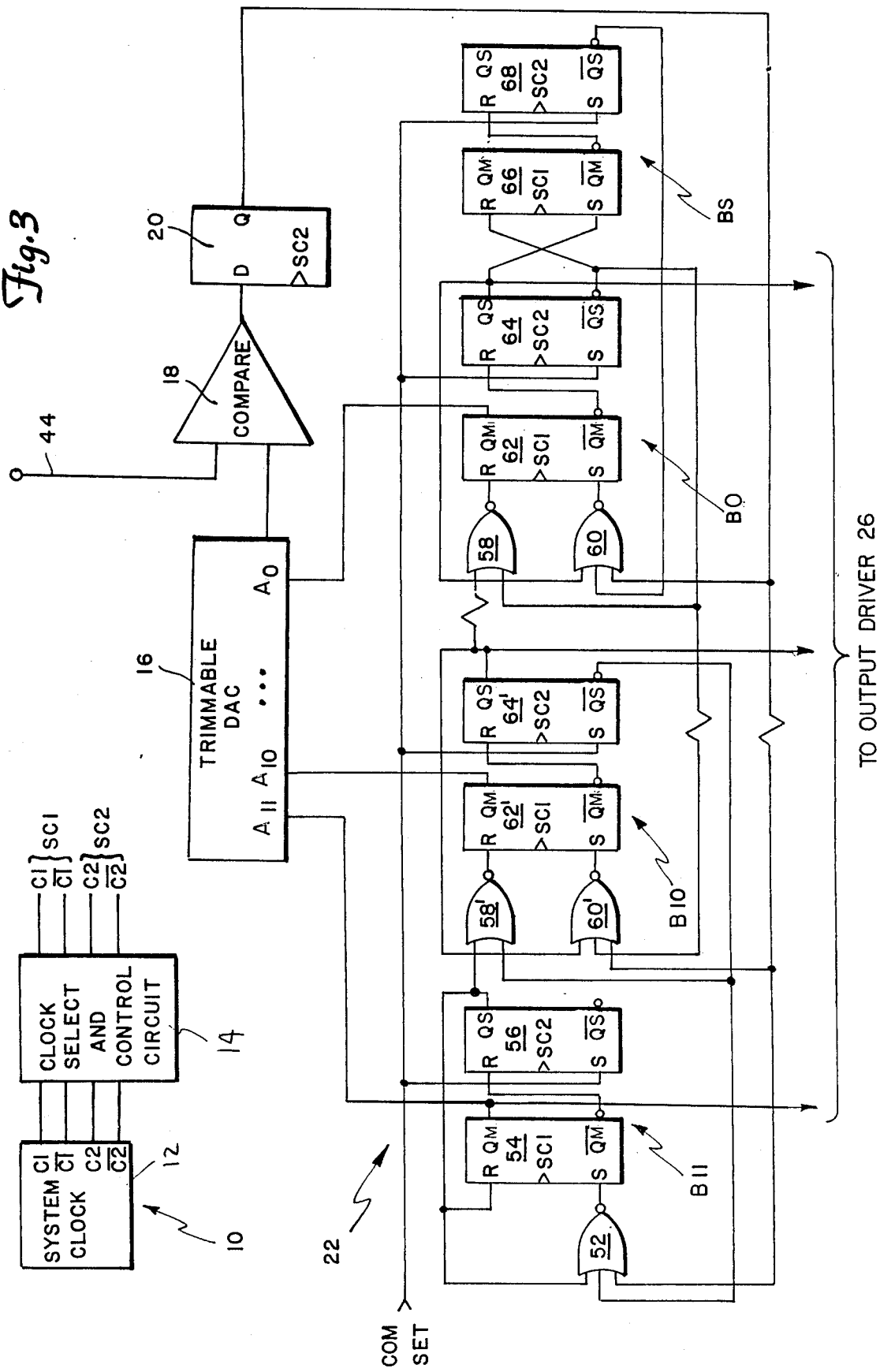
FIG. 3 is a schematic representation of the analog-to-digital converter shown in FIGS. 1 and 2 when the successive approximation and shift register is operating in its successive approximation register mode.

With test clock signal TC forced to a logic LOW state, and its complement $\overline{TC}$ forced to a logic HIGH state, successive approximation and shift register 22 functions in a well-known manner as a successive approximation register. FIG. 3 schematically illustrates ADC 10 with successive approximation and shift register 22 functioning in its successive approximation register mode. The operation of a successive approximation register such as 22 (in its successive approximation mode) in conjunction with ADC 10 is known, and disclosed, for example in Chapter 15 of Grebene, *Bipolar and MOS Analog Integrated Circuit Design*.

Inputs $A_0$–$A_{11}$ of DAC 16 are first set to an initial value (usually half-scale) through the application of a COM SET signal to begin a new analog-to-digital conversion. Comparator 18 determines whether input voltage $V_{IN}$ is greater than or less than the voltage output terminal 50 of DAC 16. The low-true output signal of the comparator is latched by latch 20 with the output of the latch then applied to bits B0–B11 of register 22. Inputs from adjacent bits use the next-bit slave latch signals from adjacent bits in a conventional manner to control behavior of the master latches. Register 22 thereby holds partial results, and sets up the $A_0$–$A_{11}$ inputs to DAC 16 for succeeding comparisons. This procedure is repeated until all output bits QM0–QM11 are set, completing the analog-to-digital conversion.

The use of successive approximation and shift register 22 facilitates the testing and post-fabrication trimming of ADC 10, and thereby makes the product more reliable. The only penalty incurred in the design illustrated in FIGS. 2A–2D is the use of eight additional transistors per bit (e.g., transistors Q10, Q11, Q15, Q16, Q23, Q24, Q28 and Q29 for bit B11) and a buffer (not shown) to drive test clock signals TC and $\overline{TC}$. Since the transistors described above are implemented in existing current flow paths, the shift register test mode advantages are gained without any additional power dissipation by register 22 when operating in its successive approximation register mode. Furthermore, no speed penalties are incurred either.

Although the present invention has been described with reference to the preferred embodiments, those skilled in the art will recognize that changes may be made in form and detail without departing from the spirit and scope of the invention. In particular, even though the embodiment illustrated in FIG. 1 utilizes current mode logic and two-phase non-overlapping complementary clocks, other logic configurations and single-ended clocks could also be used, as could an edge-triggered scheme.

What is claimed is:

1. A single chip integrated successive approximation analog-to-digital converter, including:
   test mode terminal means for receiving test mode control signals and successive approximation mode control signals;
   test data terminal means for receiving digital test data signals;
   a trimmable digital-to-analog converter (DAC) having input terminals for receiving digital signals and for converting the digital signals to analog signals of corresponding values; and
   successive approximation register means coupled to the test mode terminal means and test data terminal means for operating in a test mode and applying the test data signals to the input terminals of the DAC in response to the test mode control signals, and for operating in a successive approximation register mode in response to the successive approximation mode control signals.

2. The analog-to-digital converter of claim 1 wherein:
   the test data terminal means serially receives the digital test data signals; and
   the successive approximation register means comprises successive approximation and shift register means for serially receiving the test data signals and for providing the test data signals to the DAC in parallel.

3. The analog-to-digital converter of claim 2 and further including:
   an input terminal for receiving analog input signals;
   a comparator coupled to the input terminal and the DAC; and
   a latch coupled between the comparator and the successive approximation register means.

4. The analog-to-digital converter of claim 3 wherein the successive approximation and shift register means includes bipolar transistors.

5. The analog-to-digital converter of claim 3 wherein the successive approximation and shift register means is implemented with current mode logic.

* * * * *